United States Patent
Sugino

(10) Patent No.: US 9,698,581 B2
(45) Date of Patent: Jul. 4, 2017

(54) SHIELDED CONDUCTIVE PATH

(71) Applicant: Sumitomo Wiring Systems, Ltd., Yokkaichi, Mie (JP)

(72) Inventor: Hidetoshi Sugino, Mie (JP)

(73) Assignee: Sumitomo Wiring Systems. Ltd., Yokkaichi, Mie (JP)

( * ) Notice: Subject to any disclaimer, the term of this patent is extended or adjusted under 35 U.S.C. 154(b) by 0 days.

(21) Appl. No.: 15/341,657

(22) Filed: Nov. 2, 2016

(65) Prior Publication Data
US 2017/0133827 A1    May 11, 2017

(30) Foreign Application Priority Data
Nov. 10, 2015    (JP) .................................. 2015-220128

(51) Int. Cl.
| | | |
|---|---|---|
| *H05K 9/00* | (2006.01) | |
| *H02G 3/04* | (2006.01) | |
| *B60R 16/02* | (2006.01) | |

(52) U.S. Cl.
CPC ....... *H02G 3/0481* (2013.01); *B60R 16/0215* (2013.01); *H02G 3/0406* (2013.01); *H05K 9/0007* (2013.01); *H05K 9/0098* (2013.01)

(58) Field of Classification Search
CPC .......................... H02G 3/0406; H05K 9/0098
See application file for complete search history.

(56) References Cited

U.S. PATENT DOCUMENTS

| | | | |
|---|---|---|---|
| 6,417,451 B1 * | 7/2002 | Uchiyama ........... | B60R 16/0215 174/72 A |
| 8,981,221 B2 * | 3/2015 | Sawada ............... | B60R 16/0215 174/102 R |
| 2004/0107533 A1* | 6/2004 | Nishihara ........... | B60R 16/0222 16/2.1 |
| 2013/0068522 A1* | 3/2013 | Ogawa ................ | B60R 16/0215 174/72 A |
| 2013/0140054 A1* | 6/2013 | Kato ........................ | H02G 1/00 174/68.3 |
| 2014/0027147 A1* | 1/2014 | Yamamoto ........... | H02G 3/0462 174/68.3 |
| 2014/0060922 A1* | 3/2014 | Weyrich .............. | B60R 16/0215 174/70 R |
| 2014/0151116 A1* | 6/2014 | Doshita .................... | H02G 3/32 174/70 R |

(Continued)

FOREIGN PATENT DOCUMENTS
JP    2010215010 A    9/2010

*Primary Examiner* — Hung V Ngo
(74) *Attorney, Agent, or Firm* — Reising Ethington P.C

(57) ABSTRACT

A shielded conductive path with which a clamp that can be easily attached to a vehicle body. The shielded conductive path includes a shielding pipe having an insertion space into which an electrical wire is insertable, a resin pipe (a resin portion) surrounding an outer circumference of the shielding pipe, and a clamp that is fitted to the outside of the resin pipe and is to be attached to a vehicle body. An engagement protrusion is provided on one of the clamp and the resin pipe, the engagement protrusion protruding toward the other of the clamp and the resin pipe, and an engagement receiving portion for receiving the engagement protrusion is provided on the other of the clamp and the resin pipe, the engagement receiving portion having an opening to the side of the one of the clamp and the resin pipe.

5 Claims, 7 Drawing Sheets

(56) References Cited

U.S. PATENT DOCUMENTS

| | | | |
|---|---|---|---|
| 2014/0209764 A1* | 7/2014 | Jackson, Jr. | H02G 3/0431 248/73 |
| 2014/0251683 A1* | 9/2014 | Yamamoto | H02G 3/0406 174/72 A |
| 2015/0034382 A1* | 2/2015 | Yoshida | B60R 16/0215 174/72 A |
| 2015/0083462 A1* | 3/2015 | Yoshida | F16B 2/06 174/136 |
| 2015/0136484 A1* | 5/2015 | Inao | B60R 16/0215 174/72 A |
| 2015/0288105 A1* | 10/2015 | Berman | H05K 9/0098 174/359 |
| 2016/0322797 A1* | 11/2016 | Kimoto | H02G 3/0468 |

* cited by examiner

SHIELDED CONDUCTIVE PATH

This application claims the benefit of Japanese Application No. JP2015-220128, filed on Nov. 10, 2015, the contents of which are hereby incorporated by reference in their entirety.

FIELD

The present invention relates to a shielded conductive path having a shield function.

BACKGROUND

Conventionally, shielded conductive paths are known that are installed under a floor of a vehicle, such as a hybrid vehicle, in order to route an electrical wire for connecting a device such as a high-voltage battery provided in a rear portion of the vehicle and a device such as an inverter or a fuse block provided in a front portion of the vehicle. For example, a shielded conductive path of JP 2010-215010A (Patent Document 1) includes an electrical wire, a metal shielding pipe into which the electrical wire is insertable, and a clamp for fixing the shielding pipe to a vehicle body. This clamp includes a grommet that is arranged along the outer circumferential surface of the shielding pipe, and a bracket that has a vehicle body fixing portion that is fixed to the vehicle body, is bent into a semicircular arc-shape and is fitted to the outside of the grommet. The shielding pipe is attached to the vehicle body via the clamp.

In the case of the above-described conventional shielded conductive path, because the clamp may slide in the axial direction or the circumferential direction with respect to the shielding pipe, there is a risk that the clamp will not be defined at a predetermined position when the shielding pipe is attached to the vehicle body, and it will be difficult to fix the clamp to the vehicle body.

The present design has been accomplished in view of the above-described circumstances, and an object of the present design is to provide a shielded conductive path with which a clamp can be easily attached to a vehicle body.

SUMMARY

A shielded conductive path of the present design includes a shielding pipe having an insertion space into which an electrical wire is insertable, a resin portion surrounding an outer circumference of the shielding pipe, and a clamp that is fitted to the outside of the resin portion and is to be fixed to a vehicle body, and an engagement protrusion is provided on one of the clamp and the resin portion, the engagement protrusion protruding toward the other of the clamp and the resin portion, and an engagement receiving portion for receiving the engagement protrusion is provided on the other of the clamp and the resin portion, the engagement receiving portion having an opening to the side of the one of the clamp and the resin portion.

According to the above-described configuration, positional shifts of the clamp with respect to the resin portion are restricted by the engagement protrusion being received by the engagement receiving portion, suppressing free movement of the clamp when the clamp is attached to the vehicle body. As a result of this, the clamp can be easily attached to the vehicle body. Here, unlike the case where the engagement protrusion or the engagement receiving portion is provided in a metal portion, the engagement protrusion or the engagement receiving portion is provided in the resin portion, and thus it is easily processed, increasing the degree of freedom of molding. Also, unlike with a metal tube, if a portion exposed to the outside is a resin portion, its coating is not substantially peeled off when the shielding pipe is bent or the like, and thus an identification function indicating a high voltage or the like can be favorably exhibited by applying a predetermined color to the resin portion.

DRAWINGS

DESCRIPTION

A preferable embodiment of the shielded conductive path will be described below.

The engagement protrusion may be provided on the clamp, and the engagement receiving portion may be provided on the resin portion. If the engagement receiving portion is provided on the resin portion, it is not necessary to provide a protruding portion on the resin portion, and thus the resin portion can be easily manufactured by extrusion molding or the like.

The engagement receiving portion may be a recessed portion that has a bottom and may be open only to the outside of the resin portion. According to this, because the shielding pipe is not exposed to an outer portion through the engagement receiving portion, it is possible to avoid a situation where water enters the shielding pipe and a defect occurs.

The resin portion may be separate from the shielding pipe, and may be fitted to the outside of the shielding pipe. If the resin portion and the shielding pipe are integrally joined to each other, large equipment such as an insert molding machine is required, and there is a concern that it is difficult to manufacture the resin portion and the shielding pipe. In this aspect, according to the above-described configuration, the shielding pipe and the resin portion can be easily manufactured by extruding them individually, or the like.

The engagement protrusion may be fitted with play to the engagement receiving portion. According to this, an error in attachment of the clamp and the vehicle body or the like can be eliminated over a range in which the engagement protrusion can move with respect to the engagement receiving portion, and thus the clamp can be more easily attached to the vehicle body. Note that "fit with play" herein refers to the engagement protrusion being fitted with play to the engagement receiving portion with play (a gap).

Working Example 1

Figure 1:
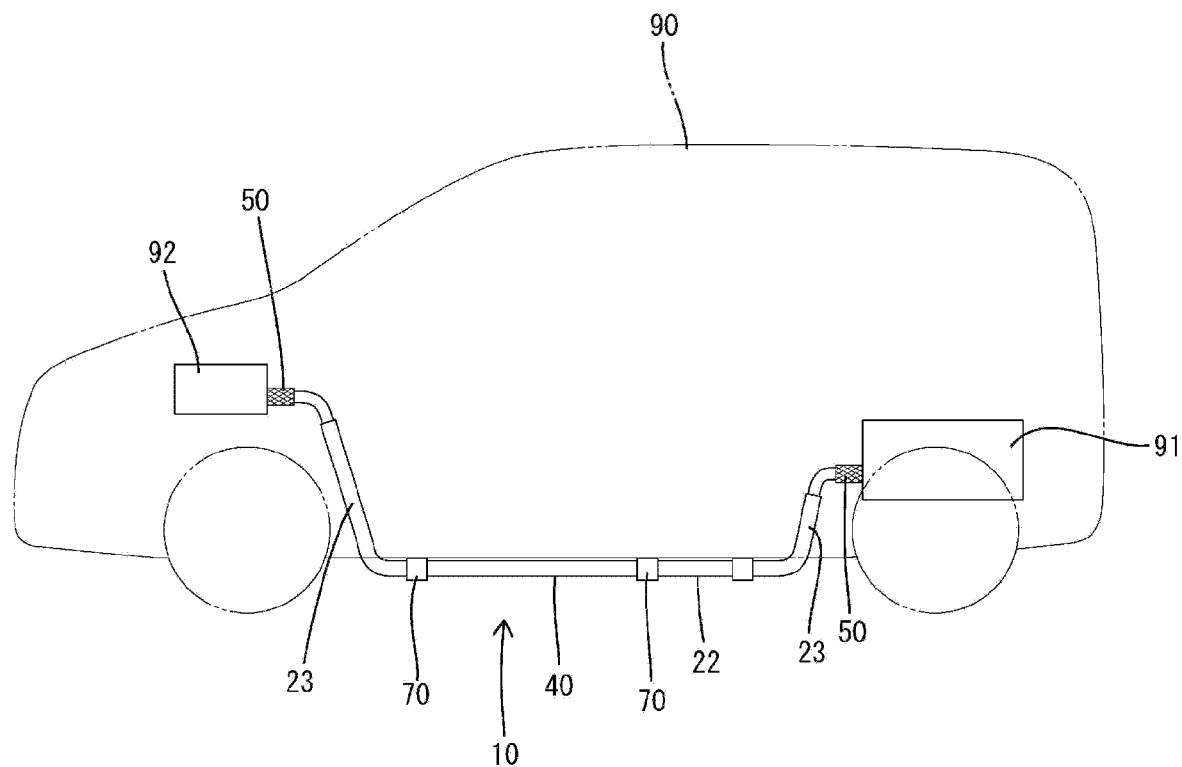
FIG. 1 is a side view showing a path in which a shielded conductive path according to Working Example 1 of the present design is laid out.

Hereinafter, Working Example 1 of the present design will be described with reference to FIGS. 1 to 7. As shown in FIG. 1, a shielded conductive path 10 according to Working Example 1 is routed under a floor of a vehicle body 90 in a hybrid vehicle or the like, in order to connect a device 91 such as a high-voltage battery provided in a rear portion of the vehicle body 90 to a device 92 such as an inverter or a fuse block provided in a front portion of the vehicle body 90, for example. Note that the devices 91 and 92 are accommodated in a conductive shield case.

Figure 2:
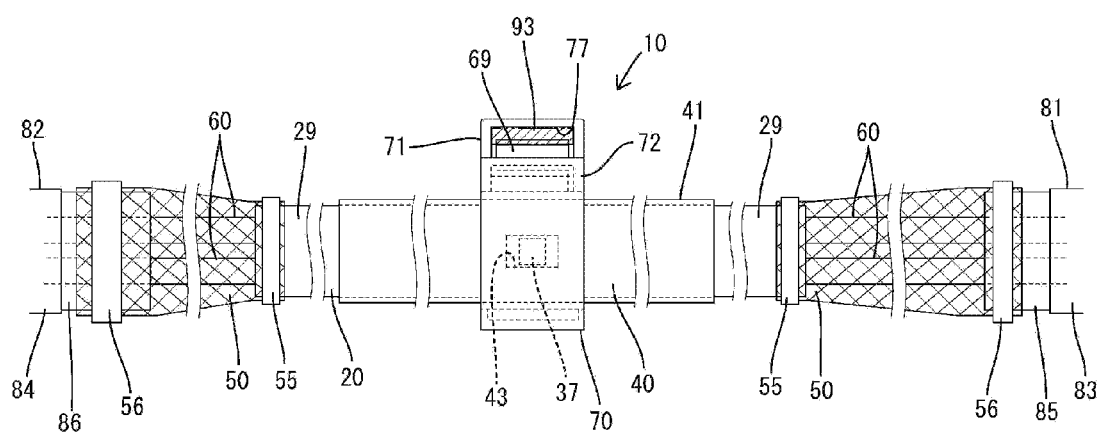
FIG. 2 is a side view of the shielded conductive path connected to a connector of a device.

As shown in FIG. 2, the shielded conductive path 10 includes a plurality of (two in Working Example 1) electrical wires 60, a shielding pipe 20, a resin pipe 40 (resin portion), and a clamp 70.

Figure 4:
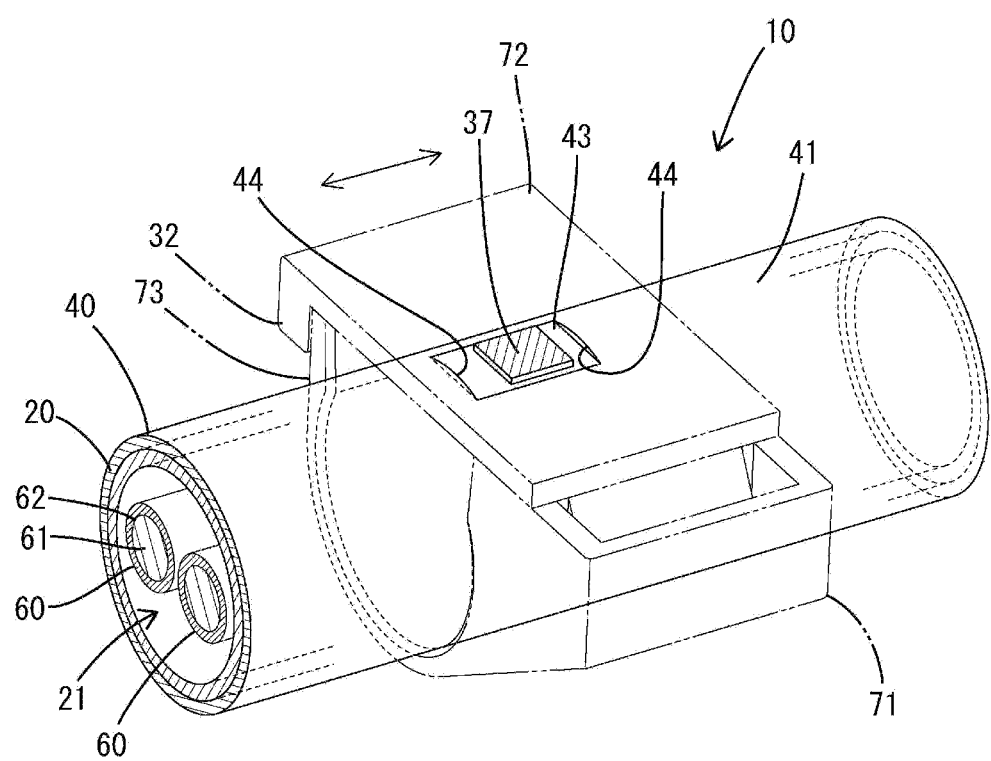
FIG. 4 is a perspective view showing a state in which an engagement protrusion is received by an engagement receiving portion.
Figure 5:
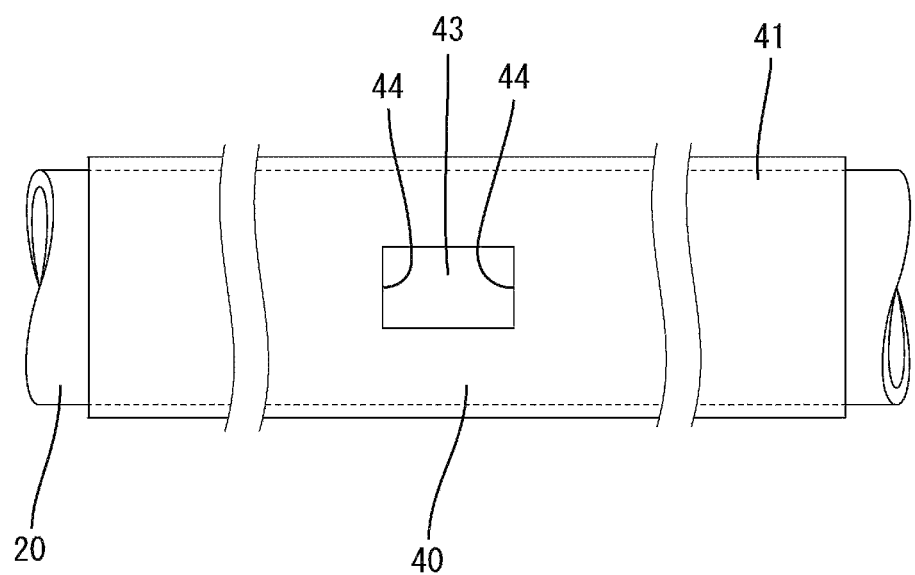
FIG. 5 is a side view of a resin pipe that is fitted to the outside of a shielding pipe.

As shown in FIG. 4, the electrical wires 60 are unshielded electrical wires, each electrical wire 60 being constituted by a conductor 61 constituted by a plurality of core wires and a coating 62 that covers the periphery of the conductor 61 and is made of an insulating resin. Terminal metal fittings (not shown) are connected to the ends of the electrical wires 60. The terminal metal fittings are accommodated in housings 83 and 84 of connectors 81 and 82 of the corresponding devices 91 and 92.

The shielding pipe 20 is made of metal (iron, aluminum, copper, stainless steel, or the like), and is formed by extrusion molding into a cross-sectional shape that is substantially uniform in the axial direction (longitudinal direction). Specifically, the shielding pipe 20 has a tubular (specifically, cylindrical) shape, having openings at both ends in the axial direction. An inner portion of the shielding pipe 20 serves as an insertion space 21 into which two electrical wires 60 are inserted together.

The shielding pipe 20 is three-dimensionally bent together with the resin pipe 40 along the path in which the electrical wires 60 are routed, and in the case of Working Example 1, as shown in FIG. 1, the shielding pipe 20 has its lowest portion 22 routed at the lowest position in the routing path, and rising portions 23 that respectively obliquely rise from both ends in the axial direction of the lowest portion 22 toward the devices 91 and 92.

The resin pipe 40 is made of a synthetic resin (polypropylene, polyamide, polybutylene terephthalate, for example), is separate from the shielding pipe 20, and is formed by extrusion molding into a cross-sectional shape that is substantially uniform in the axial direction. In the case of Working Example 1, to indicate a high-voltage circuit, an orange resin or the like is extruded to produce the resin pipe 40, and the entire resin pipe 40 is colored with an identification portion 41, which may be orange, for example. As shown in FIG. 2, the resin pipe 40 is molded such that the full length of the resin pipe 40 is shorter than the full length of the shielding pipe 20, and is removably fitted to the outside of the shielding pipe 20.

This resin pipe 40 has a cylindrical shape whose both ends in the axial direction are open. The inner diameter of the resin pipe 40 is substantially the same as the outer diameter of the shielding pipe 20, or is slightly smaller than the outer diameter of the shielding pipe 20. Thus, the resin pipe 40 is fitted to the outside of the shielding pipe 20 substantially without a gap.

Figure 6:
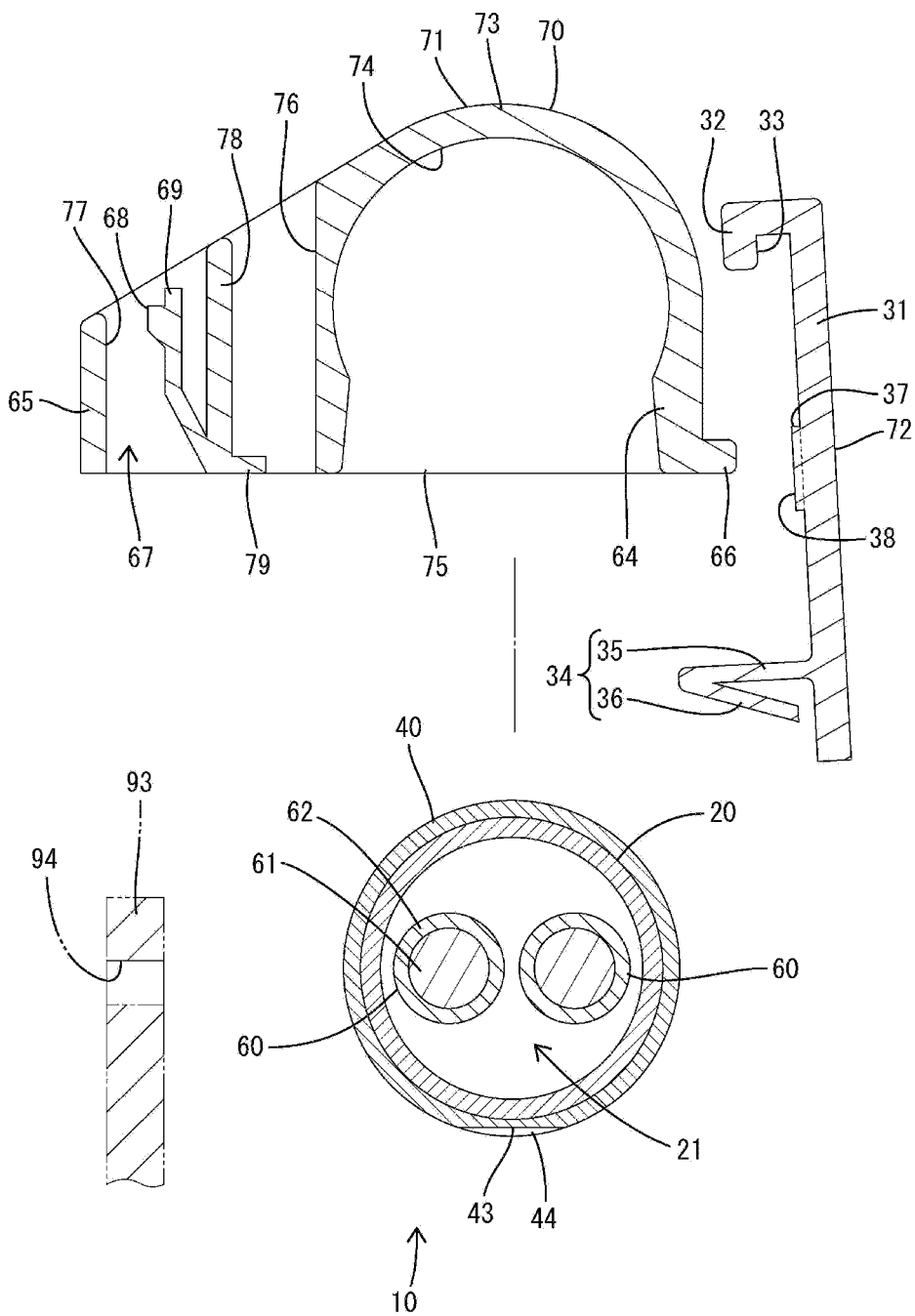
FIG. 6 is an exploded cross-sectional view of the clamp that is fitted to the outside of the resin pipe.

As shown in FIG. 4, an engagement receiving portion (locked portion) 43 that has a recessed shape having a bottom and an opening is provided on the outer circumferential surface of the resin pipe 40. The engagement receiving portion 43 has a rectangular cross-section (specifically, a rectangular cross-section that extends in the axial direction), and as shown in FIG. 6, the engagement receiving portion 43 has a shape obtained by approximately linearly cutting off an outer portion of a wall of the resin pipe 40 in its chord direction. As shown in FIG. 4, both ends in the axial direction of the engagement receiving portion 43 serve as stopper surfaces 44 that can abut against an engagement protrusion (locking protrusion) 37 (which will be described later) of the clamp 70. Note that in the case of Working Example 1, a plurality of the engagement receiving portions 43 are provided in the axial direction of the resin pipe 40 at intervals.

As shown in FIG. 2, portions of the electrical wires 60 that are led out from both ends of the shielding pipe 20 to the outside are collectively surrounded by braided members 50. The braided member 50 is obtained by weaving a conductive thin metal wire (copper, for example) into a mesh and forming the woven metal wire into tubular shape. Note that metal foil may be wrapped around the electrical wires 60 instead of the braided member 50.

One end in the axial direction of the braided member 50 is conductively fixed to the outer circumferential surface of an end of the shielding pipe 20 by that one end being crimped by a metal band 55. Also, the other ends in the axial direction of the braided members 50 are conductively fixed to shield shells 85 and 86 of the connectors 81 and 82 of the devices 91 and 92 by the other ends being crimped by metal bands 56.

Figure 7:
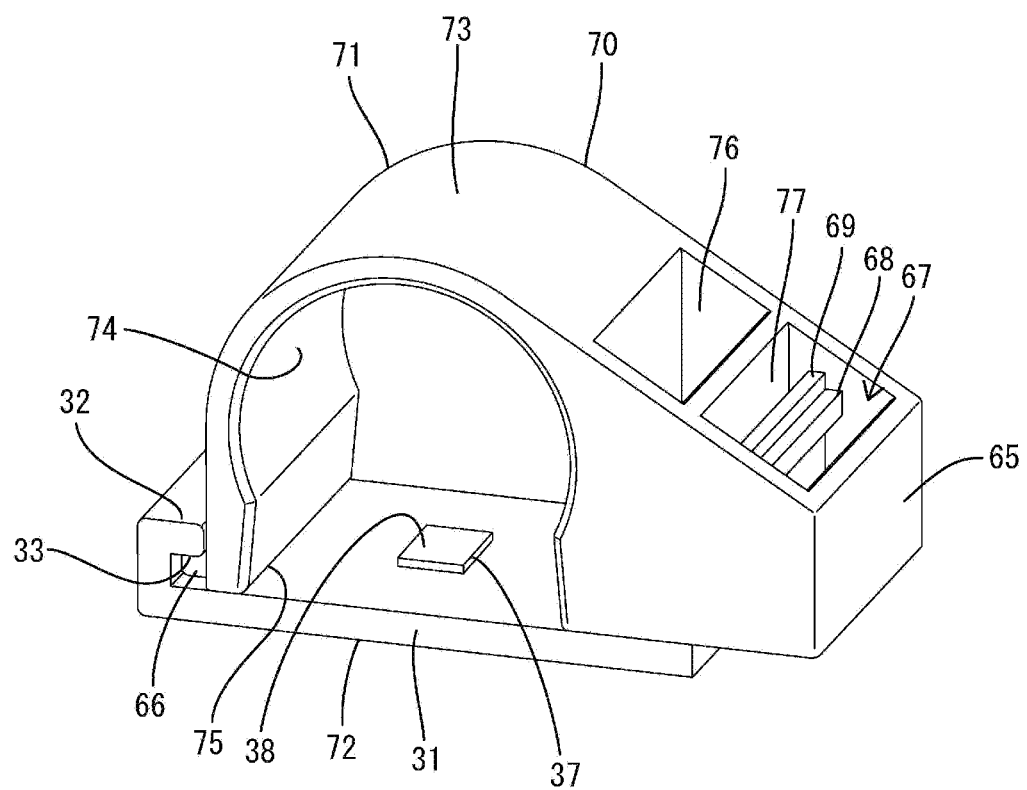
FIG. 7 is a perspective view of the clamp.

Subsequently, a structure of the clamp 70 will be described. The clamp 70 is made of a synthetic resin, and as shown in FIGS. 6 and 7, is constituted by a main member 71 having an opening on its one surface and a cover member 72 that is separate from the main member 71 and shuts one surface opening 75 of the main member 71. The main member 71 has a fitting receiving portion 73 that is to be fitted to the outside of the resin pipe 40. An inner circumferential surface of the fitting receiving portion 73 serves as a curved surface 74 having an arc-shaped cross section (specifically, having a major arc-shaped cross-section), and has a shape extending along the inner circumferential surface of the resin pipe 40. The one surface opening 75 of the main member 71 is disposed at a position in the fitting receiving portion 73 opposite to the bottom of the curved surface 74. The resin pipe 40 is inserted into the fitting receiving portion 73 through the one surface opening 75, and is held along the curved surface 74.

Also, the main member 71 has a lock structure at a position located at the same level as the fitting receiving portion 73. The lock structure has a cover lock hole 76 disposed at a position near the fitting receiving portion 73 and a vehicle body lock hole 77 disposed at a position opposite to the fitting receiving portion 73 with the cover lock hole 76 between the fitting receiving portion 73 and the vehicle body lock hole 77. The cover lock hole 76 and the vehicle body lock hole 77 are through holes extending in a direction in which the resin pipe 40 is inserted, and are disposed in parallel to each other separated by a partition 78.

As shown in FIG. 6, an edge of the partition 78 on the inner surface of the cover lock hole 76 is provided with a cover lock protrusion 79. The cover lock protrusion 79 slightly protrudes inwardly in the horizontal direction toward the one surface opening 75 in the form of eaves.

An edge of the partition 78 on the inner surface of the vehicle body lock hole 77 is provided with a vehicle body lock arm 69. The vehicle body lock arm 69 extends from a base end, which is a position where the vehicle body lock arm 69 and the cover lock protrusion 79 are located back to back with the partition 78 therebetween, obliquely upward in FIG. 6, and the vehicle body lock protrusions 68 that protrude outwardly (toward an outer wall 65, which will be described later) is provided at the end of the vehicle body lock arm 69 that extends obliquely upward. A space of the vehicle body lock hole 77 between the vehicle body lock arm 69 and the outer wall 65 that faces the vehicle body lock arm 69 outside serves as a fixed space 67 into which an attachment piece 93 provided under the floor of the vehicle body 90 is inserted.

The attachment piece 93 of the vehicle body 90 has a plate shape, and has an attachment hole 94. When the attachment piece 93 is inserted into the fixed space 67 of the vehicle body lock hole 77, when the vehicle body lock arm 69 warps and deforms due to being pressed against the attachment piece 93, and the attachment piece 93 is correctly inserted into the fixed space 67 of the vehicle body lock hole 77, the vehicle body lock arm 69 elastically returns, and the vehicle body lock protrusion 68 is fitted to the attachment hole 94. As a result of this, the vehicle body lock hole 77 is inserted into and engaged with the attachment piece 93 (see FIG. 3).

As shown in FIG. 6, a cover hooking portion 66 is provided at an edge of a side wall 64 located opposite to the lock structure in the main member 71. The cover hooking portion 66 faces away from the one surface opening 75 and slightly extends outwardly in the horizontal direction, like eaves.

As shown in FIG. 7, the cover member 72 has a tabular cover main body 31 having a flat inner surface that covers the one surface opening 75 of the main member 71. A rail 32 extending along its one side edge is provided on the cover main body 31. The rail 32 defines a hook groove 33 between the rail 32 and the inner surface of the main member 71.

Figure 3:
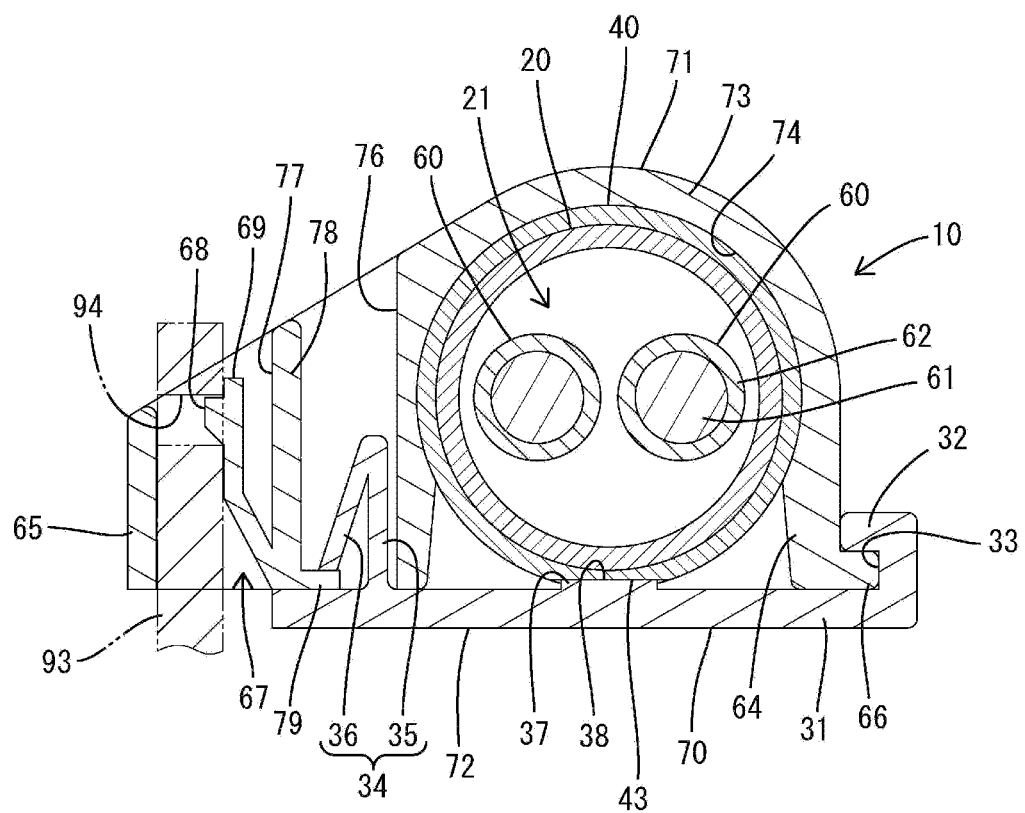
FIG. 3 is a cross-sectional view of the shielded conductive path that is cut at a position corresponding to the position of a clamp.

As shown in FIGS. 3 and 6, a lock piece 34 is provided on the inner surface of the cover main body 31 at a position near the other side edge opposite to the rail 32. The lock piece 34 has a plate shape, and is constituted by a rising piece 35 that rises at right angle with respect to the inner surface of the cover main body 31, and an elastic piece 36 that protrudes obliquely downward in FIG. 3 from an end up to which the rising piece 35 rises, and down toward the inner surface of the cover main body 31 on the side opposite to the rail 32. If the one surface opening 75 of the main member 71 is blocked by the cover member 72, the lock piece 34 is inserted into the cover lock hole 76, and the elastic piece 36 is elastically engaged with the cover hooking portion 66.

As shown in FIG. 7, the engagement protrusion 37 is provided in approximately a central portion of the inner surface of the cover main body 31. The engagement protrusion 37 has a rectangular cross-section (specifically, a square cross-section), and has a flat prismatic shape as a whole. A protruding end surface 38 of the engagement protrusion 37 is a flat surface having no unevenness. A protrusion size of the engagement protrusion 37 is smaller than the thickness of the resin pipe 40, is the same as the depth of the engagement receiving portion 43, or is slightly smaller than the depth of the engagement receiving portion 43.

Next, a method for manufacturing the shielded conductive path 10 according to Working Example 1 and its functional effects will be described.

The shielding pipe 20 and the resin pipe 40 are individually extruded with an existing extrusion machine. Next, the shielding pipe 20 and the resin pipe 40 are cut into a predetermined length. At this time, the resin pipe 40 is shorter than the shielding pipe 20. Thereafter, the engagement receiving portion 43 is provided at a predetermined position on an outer circumferential surface of the resin pipe 40.

Subsequently, the shielding pipe 20 is inserted into the resin pipe 40, and the resin pipe 40 is fitted to the outside of the shielding pipe 20. At this time, both ends in the axial direction of the shielding pipe 20 are exposed without being covered by the resin pipe 40. Also, two electrical wires 60 are inserted into the insertion space 21 of the shielding pipe 20, and the electrical wires 60 are led out from the openings at both ends of the shielding pipe 20.

The electrical wires 60 are accommodated in the housings 83 and 84 of the connectors 81 and 82, and the braided members 50 are installed between the shield shells 85 and 86 of the connectors 81 and 82 and the ends in the axial direction of the shielding pipe 20 (exposed regions 29 in FIG. 2), and the braided members 50 are fixed to shield shells 85 and 86 and the shielding pipes 20 by the metal bands 55 and 56.

Subsequently, the shielding pipe 20 and the resin pipe 40 are bent into a predetermined shape. At this time, because the shielding pipe 20 and the resin pipe 40 have a tubular shape having a perfectly circular cross-section, a conventional pipe bender can be used as is. Note that in the case of Working Example 1, the engagement receiving portion 43 of the resin pipe 40 is disposed at a position corresponding to the position of the lowest portion 22.

Subsequently, the main member 71 of the clamp 70 is fitted to the resin pipe 40 from outside, and the resin pipe 40 is inserted into the fitting receiving portion 73 of the main member 71. At this time, the resin pipe 40 is held in the fitting receiving portion 73, being sandwiched elastically from both sides in the diameter direction. Also, the engagement receiving portion 43 of the resin pipe 40 is disposed at a position facing the one surface opening 75 of the main member 71.

Next, in a state in which the cover hooking portion 66 of the main member 71 is inserted into the hook groove 33 of the rail 32 of the cover member 72, and the rail 32 is hooked on the cover hooking portion 66, the lock piece 34 is inserted into the cover lock hole 76 of the main member 71, and the elastic piece 36 of the lock piece 34 is elastically engaged with the cover lock protrusion 79 of the main member 71. Accordingly, as shown in FIG. 3, the cover member 72 is held by the main member 71 in a closed state, is disposed such that the cover main body 31 covers the electrical wires 60, and the engagement protrusion 37 is fitted to the engagement receiving portion 43. At this time, the protruding end surface 38 of the engagement protrusion 37 is disposed facing the back surface of the engagement receiving portion 43 across a small gap, and as shown in FIG. 4, both end surfaces in the axial direction of the engagement protrusion 37 face the stopper surface 44 of the engagement receiving portion 43 across a large gap. Thus, the engagement protrusion 37 is fitted to the engagement receiving portion 43, having only little play in the circumferential direction and more play in the axial direction than in the circumferential direction. In this manner, the clamp 70 is held in a state in which the clamp 70 is approximately positioned in the axial direction and the circumferential direction with respect to a predetermined position of the resin pipe 40 (a position where the engagement receiving portion 43 is provided). Note that if the cover member 72 is held by the main member 71 in a closed state, the opening at one end of the cover lock hole 76 of the main member 71 is blocked by the cover main body 31, but the opening at one end of the vehicle body lock hole 77 of the main member 71 is kept open.

Subsequently, the clamp 70 is fixed to the vehicle body 90. At this time, the attachment piece 93 is inserted into the vehicle body lock hole 77 of the main member 71, and the attachment piece 93 is elastically engaged with the vehicle body lock arm 69. Thereby, the clamp 70 is attached to and held by the attachment piece 93 (see FIGS. 2 and 3).

As described above, in Working Example 1, since the clamp 70 is approximately positioned with respect to the resin pipe 40, when the clamp 70 is attached to the vehicle body 90, the clamp 70 can correctly face a position to which the vehicle body 90 is attached (a position where the attachment piece 93 is provided). Thus, the clamp 70 can be smoothly fixed to the vehicle body 90.

Also, even if the clamp 70 slightly shifts from the position to which the vehicle body 90 is attached, due to circumstances such as an error in attachment, the position of the clamp 70 shifts with respect to the resin pipe 40 due to the engagement protrusion 37 displacing in the axial direction and the circumferential direction in the engagement receiving portion 43, the clamp 70 being led to a state in which the clamp 70 faces to face the position to which the vehicle body 90 is attached. Thus, an error in attachment or the like can be eliminated over a range in which the engagement protrusion 37 is displaceable in the engagement receiving portion 43, and the clamp 70 can be fixed to the vehicle body 90 without obstruction. Note that with regard to the axial direction, the engagement protrusion 37 is movable between the stopper surfaces 44 at both ends in the axial direction of the engagement receiving portion 43.

As described above, according to Working Example 1, positional shifts of the clamp 70 with respect to the resin pipe 40 are restricted by the engagement protrusion 37 being received by the engagement receiving portion 43, and thus it is possible to suppress free movement of the clamp 70 when assembled to the vehicle body 90, and to easily attach the clamp 70 to the vehicle body 90. In this case, unlike the case where the engagement receiving portion 43 is provided in a metal portion, the engagement receiving portion 43 is provided in the resin pipe 40, and thus it is easily processed, increasing the degree of freedom of molding. Moreover, because the engagement receiving portion 43 does not protrude from the outer circumferential surface of the resin pipe 40, the resin pipe 40 can be easily manufactured by extrusion molding.

Also, an identification function indicating that the shielded conductive path 10 is high voltage can be favorably exhibited due to the resin pipe 40 having an identification portion 41 to which a predetermined color is applied being exposed outside. In this case, unlike with a metal pipe, there is no substantial concern that coating is peeled off from the resin pipe 40 when the shielding pipe 20 is bent, and the reliability of the identification function can be ensured.

Also, since the engagement receiving portion 43 has a recessed shape having a bottom and an opening on the outer surface of the resin pipe 40, the shielding pipe 20 is not exposed to the outside through the engagement receiving portion 43, avoiding malfunction caused by water entering the shielding pipe 20.

Also, since the resin pipe 40 is separate from the shielding pipe 20 and fitted to the outside of the shielding pipe 20, the shielding pipe 20 and the resin pipe 40 can be easily manufactured individually by extrusion molding.

Furthermore, since the engagement protrusion 37 is fitted with play to the engagement receiving portion 43, an error in attachment of the clamp 70 and the vehicle body 90 or the like can be eliminated over a range in which the engagement protrusion 37 can move with respect to the engagement receiving portion 43 in the axial direction and the circumferential direction, and the clamp 70 can be more easily attached to the vehicle body 90.

Other Working Example

Hereinafter, other working examples of the present design will be described briefly.

The shielding pipe and the resin pipe may be tubes having an oval cross-section (including an elliptic cross-section) or a rectangular cross-section.

One engagement receiving portion may be provided on the resin pipe.

The engagement receiving portion may have such a shape that it passes through the resin pipe (the resin portion) in the thickness direction.

The engagement protrusion may be provided on the main member of the clamp.

The engagement protrusion may be provided on the resin portion, and the engagement receiving portion may be provided on the clamp.

The resin pipe may have such a structure that the resin pipe is integrally joined to the shielding pipe. In the present design, it is possible to use a pipe material in which a plurality of metal layers and a plurality of resin layers are stacked.

The clamp may be formed by the main member and the cover member being integrally formed via the connection portion such as a hinge.

The engagement protrusion may be fitted to the engagement receiving portion in a state in which free movement of the engagement protrusion is restricted in either the circumferential direction or the axial direction with respect to the engagement receiving portion.

The clamp may be fixed to the vehicle body by a fixing means such as a stud bolt.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A shielded conductive path, comprising:
    a shielding pipe having an insertion space into which an electrical wire is insertable;
    a resin portion surrounding an outer circumference of the shielding pipe; and
    a clamp that is fitted to the outside of the resin portion and is to be fixed to a vehicle body, wherein an engagement protrusion is provided on one of the clamp and the resin portion, the engagement protrusion protruding toward the other of the clamp and the resin portion, and an engagement receiving portion for receiving the engagement protrusion is provided on the other of the clamp and the resin portion, the engagement receiving portion having an opening to the side of the one of the clamp and the resin portion.

2. The shielded conductive path according to claim 1, wherein
the engagement protrusion is provided on the clamp, and the engagement receiving portion is provided on the resin portion.

3. The shielded conductive path according to claim 2, wherein
the engagement receiving portion is a recessed portion that has a bottom and is open only to the outside of the resin portion.

4. The shielded conductive path according to claim 1, wherein
the resin portion is separate from the shielding pipe, and is fitted to the outside of the shielding pipe.

5. The shielded conductive path according to claim 1, wherein
the engagement protrusion is fitted with play to the engagement receiving portion.

* * * * *